(12) United States Patent
Jeng et al.

(10) Patent No.: US 8,334,582 B2
(45) Date of Patent: Dec. 18, 2012

(54) PROTECTIVE SEAL RING FOR PREVENTING DIE-SAW INDUCED STRESS

(75) Inventors: Shin-Puu Jeng, Hsin-Chu (TW); Hsien-Wei Chen, Sinying (TW); Shang-Yun Hou, Jubei (TW); Hao-Yi Tsai, Hsin-Chu (TW); Anbiarshy N. F. Wu, Chiayi (TW); Yu-Wen Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 543 days.

(21) Appl. No.: 12/347,026

(22) Filed: Dec. 31, 2008

(65) Prior Publication Data

US 2009/0321890 A1    Dec. 31, 2009

Related U.S. Application Data

(60) Provisional application No. 61/076,046, filed on Jun. 26, 2008.

(51) Int. Cl.
*H01L 23/544* (2006.01)

(52) U.S. Cl. ........... 257/620; 257/E23.193; 257/E23.18; 257/E23.116; 257/E23.127; 257/E21.523; 257/E21.524

(58) Field of Classification Search .................. 257/620, 257/E23.193, E23.18, E23.116, E23.127, 257/E21.523, E21.524
See application file for complete search history.

(56) References Cited

U.S. PATENT DOCUMENTS

| | | | |
|---|---|---|---|
| 5,047,711 | A | 9/1991 | Smith et al. |
| 5,096,855 | A | 3/1992 | Vokoun, III |
| 5,136,364 | A | 8/1992 | Byrne |
| 5,206,181 | A | 4/1993 | Gross |
| 5,239,191 | A | 8/1993 | Sakumoto et al. |

(Continued)

FOREIGN PATENT DOCUMENTS

CN    1542505 A    11/2004
(Continued)

OTHER PUBLICATIONS

Pidin, S., et al., "MOSFET Current Drive Optimization Using Silicon Nitride Capping Layer for 65-nm Technology Node," 2004 Symposium on VLSI Technology Digest of Technical Papers, IEEE, Jul. 2004, pp. 54-55.

(Continued)

*Primary Examiner* — Fei Fei Yeung Lopez
(74) *Attorney, Agent, or Firm* — Slater & Matsil, L.L.P.

(57) ABSTRACT

A semiconductor chip includes a semiconductor substrate; a plurality of low-k dielectric layers over the semiconductor substrate; a first passivation layer over the plurality of low-k dielectric layers; and a second passivation layer over the first passivation layer. A first seal ring is adjacent to an edge of the semiconductor chip, wherein the first seal ring has an upper surface substantially level to a bottom surface of the first passivation layer. A second seal ring is adjacent to the first seal ring and on an inner side of the semiconductor chip than the first seal ring. The second seal ring includes a pad ring in the first passivation layer and the second passivation layer. A trench ring includes at least a portion directly over the first seal ring. The trench ring extends from a top surface of the second passivation layer down to at least an interface between the first passivation layer and the second passivation layer.

20 Claims, 6 Drawing Sheets

U.S. PATENT DOCUMENTS

| | | | |
|---|---|---|---|
| 5,285,082 A | 2/1994 | Axer | |
| 5,371,411 A | 12/1994 | Hara et al. | |
| 5,751,065 A | 5/1998 | Chittipeddi et al. | |
| 5,831,330 A | 11/1998 | Chang | |
| 5,834,829 A | 11/1998 | Dinkel et al. | |
| 6,022,791 A | 2/2000 | Cook et al. | |
| 6,114,766 A | 9/2000 | Shields | |
| 6,121,677 A | 9/2000 | Song et al. | |
| 6,284,657 B1 | 9/2001 | Chooi et al. | |
| 6,300,223 B1 | 10/2001 | Chang et al. | |
| 6,350,622 B2 | 2/2002 | Misewich et al. | |
| 6,358,839 B1 | 3/2002 | Li et al. | |
| 6,365,958 B1 | 4/2002 | Ibnabdeljalil et al. | |
| 6,384,463 B1 | 5/2002 | Miles et al. | |
| 6,483,173 B2 | 11/2002 | Li et al. | |
| 6,492,716 B1 | 12/2002 | Bothra et al. | |
| 6,495,918 B1 | 12/2002 | Brintzinger | |
| 6,521,975 B1 | 2/2003 | West et al. | |
| 6,566,736 B1 | 5/2003 | Ogawa et al. | |
| 6,605,861 B2 | 8/2003 | Toyoda | |
| 6,796,024 B2 | 9/2004 | Katoh et al. | |
| 6,806,168 B2 | 10/2004 | Towle et al. | |
| 6,841,455 B2 | 1/2005 | West et al. | |
| 6,861,754 B2 | 3/2005 | Lin et al. | |
| 6,861,755 B2 | 3/2005 | Hosoda et al. | |
| 6,876,062 B2 | 4/2005 | Lee et al. | |
| 6,876,064 B2 | 4/2005 | Matumoto et al. | |
| 6,876,946 B2 | 4/2005 | Yasuda et al. | |
| 6,939,736 B2 | 9/2005 | Grabham et al. | |
| 6,963,389 B2 | 11/2005 | Fukada | |
| 6,998,712 B2 | 2/2006 | Okada et al. | |
| 7,042,099 B2 | 5/2006 | Kurashima et al. | |
| 7,087,452 B2 | 8/2006 | Joshi et al. | |
| 7,126,225 B2 | 10/2006 | Su et al. | |
| 7,126,255 B2 | 10/2006 | Yamaguchi et al. | |
| 7,129,565 B2 | 10/2006 | Watanabe et al. | |
| 7,129,566 B2 | 10/2006 | Uehling et al. | |
| 7,135,384 B2 | 11/2006 | Takyu et al. | |
| 7,138,297 B2 | 11/2006 | Iijima et al. | |
| 7,138,700 B2 | 11/2006 | Tomita et al. | |
| 7,145,211 B2 | 12/2006 | Mallikarjunaswamy et al. | |
| 7,235,834 B2 | 6/2007 | Fukada | |
| 7,235,864 B2 | 6/2007 | Lee | |
| 7,259,445 B2 | 8/2007 | Lau et al. | |
| 7,291,874 B2 | 11/2007 | Hsu | |
| 7,294,937 B2 | 11/2007 | Su et al. | |
| 7,335,577 B2 | 2/2008 | Daubenspeck et al. | |
| 7,387,950 B1 | 6/2008 | Kuo et al. | |
| 7,407,835 B2 | 8/2008 | Chuang | |
| 7,453,128 B2 | 11/2008 | Tsutsue et al. | |
| 7,456,507 B2 | 11/2008 | Yang | |
| 7,566,915 B2 | 7/2009 | Chang et al. | |
| 7,646,078 B2 | 1/2010 | Jeng et al. | |
| 7,763,887 B2 | 7/2010 | Han | |
| 2001/0005604 A1* | 6/2001 | Lee et al. | 438/132 |
| 2001/0005617 A1 | 6/2001 | Feurle et al. | |
| 2001/0008296 A1 | 7/2001 | Gelsomini et al. | |
| 2001/0019848 A1* | 9/2001 | Misewich et al. | 438/2 |
| 2002/0024115 A1 | 2/2002 | Ibnabdeljalil et al. | |
| 2002/0130394 A1 | 9/2002 | Toyoda | |
| 2003/0003677 A1 | 1/2003 | Fukada | |
| 2004/0084777 A1 | 5/2004 | Yamanoue et al. | |
| 2004/0119164 A1 | 6/2004 | Kurashima et al. | |
| 2004/0150070 A1* | 8/2004 | Okada et al. | 257/508 |
| 2004/0150073 A1* | 8/2004 | Matumoto et al. | 257/630 |
| 2005/0009300 A1 | 1/2005 | Murari et al. | |
| 2005/0017363 A1 | 1/2005 | Lin et al. | |
| 2005/0026397 A1 | 2/2005 | Daubenspeck et al. | |
| 2005/0098893 A1 | 5/2005 | Tsutsue et al. | |
| 2005/0148115 A1 | 7/2005 | Williams et al. | |
| 2005/0151239 A1 | 7/2005 | Lee | |
| 2005/0230005 A1 | 10/2005 | Liang et al. | |
| 2005/0269702 A1 | 12/2005 | Otsuka | |
| 2005/0280120 A1 | 12/2005 | Tomita | |
| 2006/0001144 A1 | 1/2006 | Uehling et al. | |
| 2006/0012012 A1 | 1/2006 | Wang et al. | |
| 2006/0022195 A1 | 2/2006 | Wang | |
| 2006/0055002 A1 | 3/2006 | Yao et al. | |
| 2006/0055007 A1 | 3/2006 | Yao et al. | |
| 2006/0103025 A1 | 5/2006 | Furusawa et al. | |
| 2006/0125090 A1 | 6/2006 | Chen et al. | |
| 2006/0172457 A1 | 8/2006 | Huang | |
| 2006/0192265 A1 | 8/2006 | Hsu | |
| 2007/0018331 A1 | 1/2007 | Chen | |
| 2007/0090447 A1 | 4/2007 | Morimoto et al. | |
| 2007/0090547 A1 | 4/2007 | Su et al. | |
| 2007/0158788 A1 | 7/2007 | Yang | |
| 2008/0054263 A1* | 3/2008 | Han | 257/48 |
| 2008/0157284 A1* | 7/2008 | Chang et al. | 257/620 |
| 2008/0213938 A1* | 9/2008 | Kao | 438/69 |
| 2008/0265378 A1 | 10/2008 | Lee et al. | |
| 2008/0283969 A1* | 11/2008 | Jeng et al. | 257/620 |
| 2008/0299708 A1 | 12/2008 | Tsutsue | |
| 2009/0115024 A1* | 5/2009 | Jeng et al. | 257/620 |
| 2009/0115025 A1 | 5/2009 | Jung | |
| 2009/0315184 A1 | 12/2009 | Tokitoh | |
| 2009/0321890 A1 | 12/2009 | Jeng et al. | |
| 2010/0123219 A1 | 5/2010 | Chen et al. | |
| 2010/0207251 A1 | 8/2010 | Yu et al. | |

FOREIGN PATENT DOCUMENTS

| | | |
|---|---|---|
| CN | 1701418 A | 11/2005 |
| CN | 1770432 | 5/2006 |
| CN | 1830079 | 9/2006 |
| CN | 1956173 A | 5/2007 |

OTHER PUBLICATIONS

"Motorola MC7457RX1000NB Microprocessor," Sample Prep Delamination, Motorola Chipworks, Mar. 15, 2005, 1 page, Figure 3.1.3 Die Seal.

* cited by examiner

US 8,334,582 B2

PROTECTIVE SEAL RING FOR PREVENTING DIE-SAW INDUCED STRESS

This application claims the benefit of the following provisionally filed U.S. patent application: Application Ser. No. 61/076,046, filed Jun. 26, 2008, and entitled "Protective Seal Ring," which application is hereby incorporated herein by reference.

CROSS-REFERENCE TO RELATED APPLICATIONS

This application relates to the following commonly-assigned U.S. patent applications: application Ser. No. 11/842,821, filed Aug. 21, 2007, and entitled "Seal Ring Structure with Improved Cracking Protection;" and application Ser. No. 11/933,931, filed Nov. 1, 2007, entitled "Seal Ring Structure with Improved Cracking Protection and Reduced Problems," which applications are hereby incorporated herein by reference.

TECHNICAL FIELD

This invention relates to integrated circuits and more particularly to structures and formation methods of seal rings.

BACKGROUND

Seal ring formation is an important part in the back-end of semiconductor processes. Seal rings are stress protection structures around integrated circuits, which protect the internal circuit inside semiconductor chips from damage caused by the sawing of the semiconductor chips from wafers.

Typical seal rings are usually formed of interconnected metal lines and connecting vias. FIG. 1 is a schematic view of a part of seal ring 10, which is formed on an inner side of scribe line 12, sometimes also referred to as dicing line 12. Typically, there is a circuit region (not shown) on the left-hand side of the drawing.

Seal ring 10 includes interconnected metal components, which are formed of metal lines 14 and conductive vias 18, both formed in dielectric layers 16. Metal lines 14 and vias 18 are physically connected. Moreover, passivation film 20 is formed over a top layer of seal ring 10.

Because of the provision of seal ring 10 and passivation film 20, the circuit region on the inner side of seal ring 10 is protected from influences of external environments, which may cause cracking in the semiconductor chips, thus it is possible to ensure stability of properties of the semiconductor device over a long period of time. Typically, seal rings may be electrically grounded. To have greater strength, vias 18 may be interconnected, forming a continuous via bar, as shown in FIG. 2.

A further function of seal ring 10 is to protect the integrated circuits on the inner side of seal ring 10 from moisture-induced degradation. Dielectric layers 16 are typically formed of porous low-k dielectric materials. Moisture can easily penetrate through low-k dielectric layers 16 to reach the integrated circuits. Since seal ring 10 is formed of metal, it blocks the moisture penetration path and may substantially eliminate any moisture penetration.

Although continuous via bars 18, combined with metal lines 14, can protect cracking from extending into circuit regions, the conventional seal rings suffer drawbacks. First, conventionally, only one seal ring with a continuous via bar is formed. If this seal ring is damaged, there will be no structure for preventing cracks from propagating into the respective semiconductor chip. Second, the continuous via bars often have widths substantially less than the thickness of the respective overlying metal lines, and hence do not have enough strength to stop crack propagation during die sawing. Third, the cracks may propagate through interface 22 between passivation film 20 and the underlying layer into the circuit regions. New structures and formation methods are thus needed.

SUMMARY OF THE INVENTION

In accordance with one aspect of the present invention, a semiconductor chip includes a semiconductor substrate; a plurality of low-k dielectric layers over the semiconductor substrate; a first passivation layer over the plurality of low-k dielectric layers; and a second passivation layer over the first passivation layer. A first seal ring is adjacent to an edge of the semiconductor chip, wherein the first seal ring has an upper surface substantially level to a bottom surface of the first passivation layer. A second seal ring is adjacent to the first seal ring and on an inner side of the semiconductor chip than the first seal ring. The second seal ring includes a pad ring in the first passivation layer and the second passivation layer. A trench ring includes at least a portion directly over the first seal ring. The trench ring extends from a top surface of the second passivation layer down to at least an interface between the first passivation layer and the second passivation layer. Other embodiments are also disclosed.

Advantageously, by using the embodiments of the present invention, the crack-propagation caused by die-sawing is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of embodiments are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

Seal ring structures with improved crack prevention ability and methods of forming the same are provided. The variations of the embodiments are discussed. Throughout the various views and illustrative embodiments of the present invention, like reference numbers are used to designate like elements.

Figure 1:
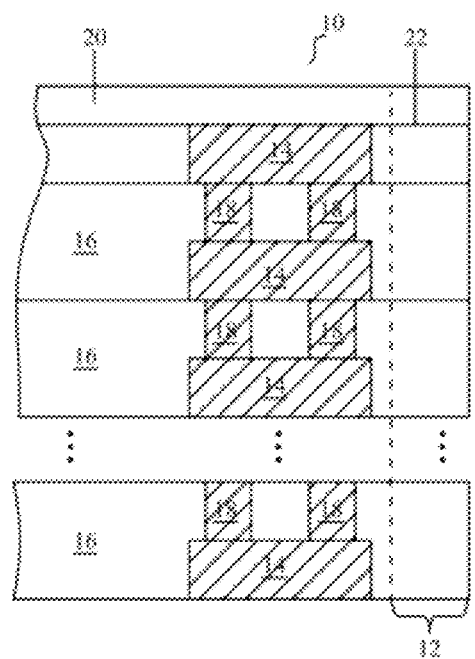
FIGS. 1 and 2 illustrate conventional seal rings.
Figure 2:
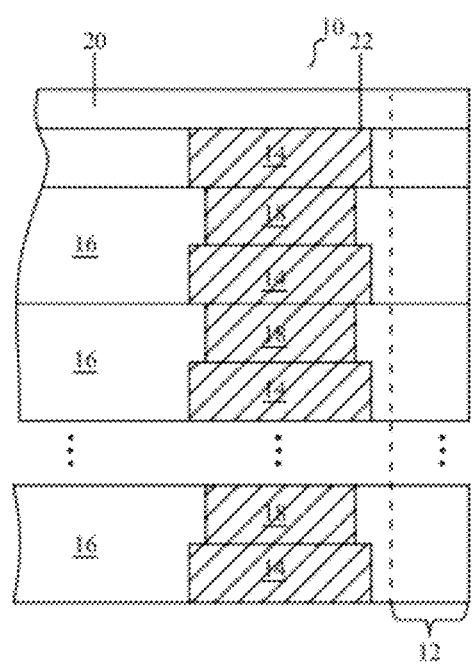
Figure 3A:
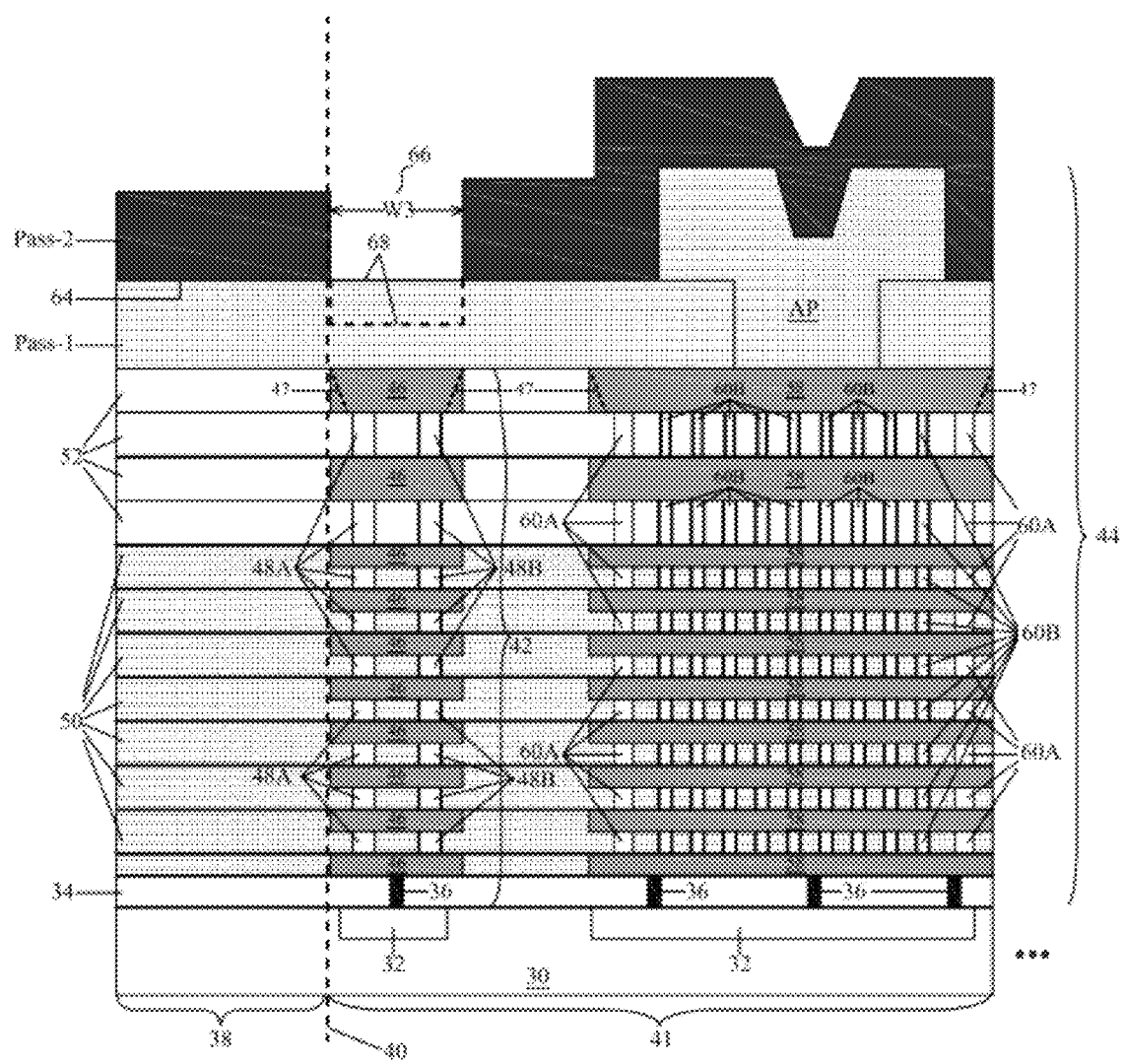
FIGS. 3A and 3B are a cross-sectional view and a top view, respectively, of an embodiment of the present invention.

FIG. 3A illustrates a first embodiment of the present invention. A portion of a semiconductor wafer includes semiconductor substrate 30, which may be formed of silicon or other group III, group IV, and/or group V elements. Semiconductor substrate 30 may be lightly doped with a p-type impurity. Heavily doped p-type (p+) regions 32 are formed at the top surface of semiconductor substrate 30. Inter-layer dielectric (ILD) 34 is formed over substrate 30.

In an embodiment, contact plugs 36 are formed in ILD 34, and are electrically connected to p+ regions 32. Contact plugs 36 are thus connected to an electrical ground (not shown). Each of contact plugs 36 may form a contact ring close to the edges of chip 41. A scribe line boundary 40 is illustrated, wherein scribe line 38 is to the left of scribe line boundary 40, and semiconductor chip 41 is to the right of scribe line boundary 40. In the die-sawing, semiconductor chips are separated along the scribe lines including scribe line 38. Accordingly, scribe line boundary 40 may be treated as an edge of semiconductor chip 41, although the real edge of chip 41 after the die-sawing may be slightly deviated from scribe line boundary 40.

Seal rings 42 and 44 are formed in semiconductor chip 41 and proximate the four edges (refer to FIG. 3C) of semiconductor chip 41. In an embodiment, the first seal ring 42 (alternatively referred to as a sacrificial seal ring), which is closer to scribe line 38, and possibly has a outer edge substantially aligned to scribe line boundary 40, is narrower than the second seal ring 44 (a main seal ring). Seal rings 42 and 44 include a plurality of metal lines 46/58 and vias 48/60 (denoted as 48A, 48B, 60A, and 60B) formed in low-k dielectric layers 50. The dielectric constants (k values) of low-k dielectric layers 50 may be lower than 3.0, and even lower than about 2.5, hence are also referred to as extreme low-k (ELK) dielectric layers 50 throughout the description. As is known in the art, bottom metal lines 46 (in the bottom metal layer, commonly known as M1) may be formed using a single damascene process, while upper metal lines 46 may be formed along with the underlying vias 48 using dual damascene processes.

Figure 3B:
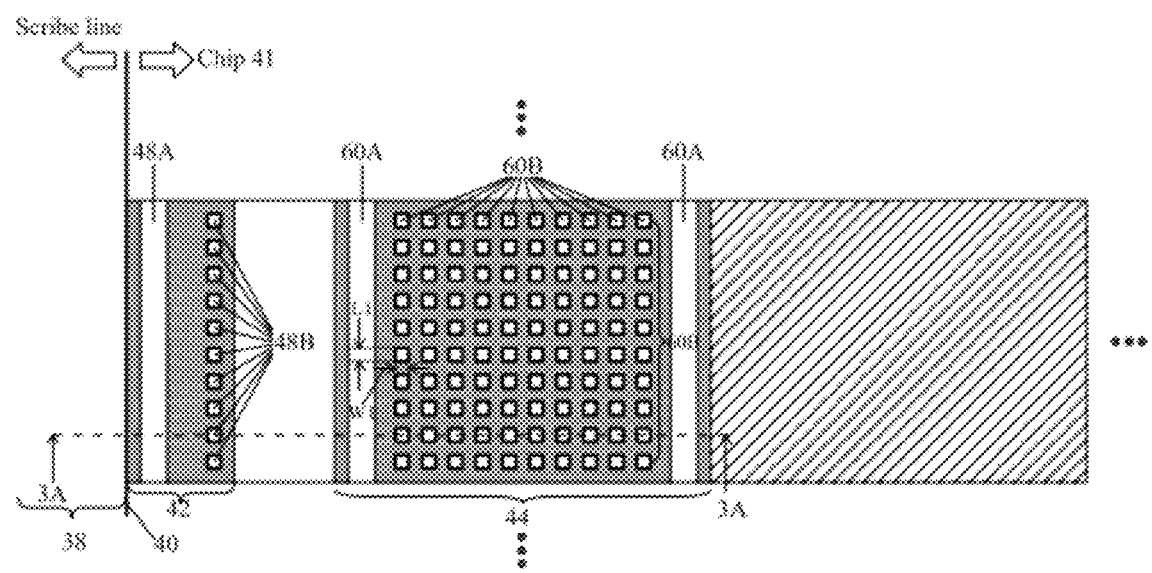
Figure 3C:
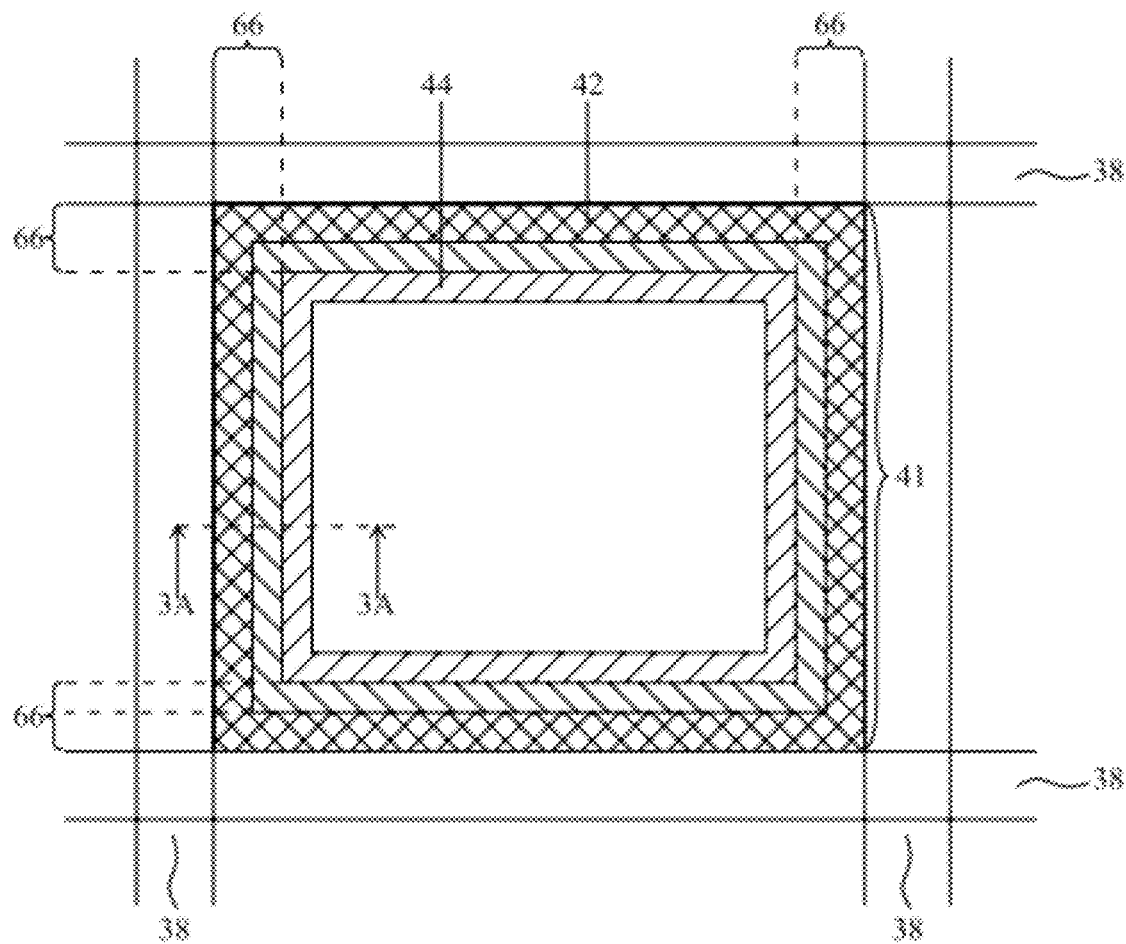
FIG. 3C schematically illustrates a top view of a semiconductor chip, a scribe line adjoining the semiconductor chip, and seal rings in the semiconductor chip.

FIG. 3C illustrates a top view of the embodiment shown in FIG. 3A, wherein the cross-sectional view shown in FIG. 3A is taken along line 3A-3A in FIG. 3C. The relative positions of semiconductor chip 41, scribe lines 38, and seal rings 42 and 44 are schematically illustrated.

Referring back to FIG. 3A, over dielectric layers 50 are top dielectric layers 52 that are immediately underlying passivation layers Pass-1 and Pass-2, in which metal lines 46/58 and vias 48/60 are formed. Top dielectric layers 52 may be formed of un-doped silicate glass (USG) in order to improve the mechanical property and prevent moisture penetration, and hence are referred to as USG layers 52 throughout the description, although they may be formed of other materials. Metal lines 46/58 and vias 48/60 may comprise copper or copper alloys, and may be formed using commonly known dual damascene processes. A first passivation layer, which is referred to as Pass-1 throughout the description, is formed over top dielectric layers 52. Throughout the description, the term "passivation layer" refers to the dielectric layers over dual damascene structures, wherein the metal features in the passivation layer are not formed using damascene processes.

Seal ring 44 further includes an aluminum ring (alternatively referred to as aluminum pad (AP), or pad ring throughout the description) over, and physically connected to, metal line 58. Aluminum ring AP may include a portion over passivation layer Pass-1, and a portion penetrating into passivation layer Pass-1. A second passivation layer Pass-2 is formed over passivation layer Pass-1 and aluminum ring AP. Passivation layers Pass-1 and Pass-2 may be formed of oxides, nitrides, and combinations thereof, and may be formed of the same or different materials. Aluminum ring AP may be formed simultaneously with the formation of bond pads (not shown) that are exposed on the top surface of semiconductor chip 41.

In an embodiment, metal lines 46/58, vias 48/60, and aluminum ring AP may have tapered profiles (not shown) with the bottom width of each of these features being smaller than the respective top width. The tapered profiles are schematically shown in the top metal lines 46/58 using dotted lines 47 as exemplary edges. Advantageously, tapered metal lines 46/58, vias 48/60, and aluminum ring AP are more effective in imparting stresses downwardly. Accordingly, the stress generated by the die sawing is more likely to be absorbed by seal rings 42 and 44. To form the tilted edges of metal lines 46/58, vias 48/60, and aluminum ring AP, in the formation of the respective trench openings and via openings, process conditions, such as the percentages of etching gases like $C_4F_8$, CHF, the percentages of oxygen and nitrogen containing gases, and/or bias power, etc., may be adjusted. In alternative embodiments, metal lines 46/58, vias 48/60, and aluminum ring AP have substantially vertical edges.

FIG. 3B illustrates a top view of the embodiment shown in FIG. 3A, wherein the cross-sectional view shown in FIG. 3A is taken along line 3A-3A in FIG. 3B. The vias connecting two layers of seal ring 42 includes via bars 48A and vias 48B (referred to as discrete vias hereinafter). Via bars 48A form close-loop rings extending along the parameter of the respective semiconductor chip 41. Discrete vias 48B form a line parallel to via bars 48A. Similarly, the line formed of discrete vias 48B extends along the four edges of the respective semiconductor chip and also has a ring-like shape.

Seal ring 44 includes via bars 60A and discrete vias 60B. Discrete vias 60B may form an array, and the array extends along the edges of the respective semiconductor chip to form a ring-like structure. In an embodiment, one of via bars 60A is on an inner side of discrete vias 60B, and the other is on an outer side (the side close to the edge of the respective semiconductor chip) of discrete vias 60B. In other embodiments, via bars 60A may be formed between discrete vias 60B. In yet other embodiments, additional via bars, which are similar to via bars 60A, may be inserted between discrete vias 60B. Discrete vias 60B each may have a width W1 substantially equal to a length L1. Alternatively, length L1 and width W1 are different, but are comparable, with a ratio of length to width being less than about 2. It is realized that if the width of seal ring 42 is large enough, more discrete vias 48B may be added to form a via array similar to discrete vias 60B. Advantageously, by forming discrete vias and thin via bars, the etching difficulty resulting from etching large dielectric areas for via openings is reduced.

As a result of sawing the wafer, cracks may occur at kerf lines and propagate into semiconductor chips. Experiments performed by inventors revealed that a significant percentage, sometimes greater than 50 percent, of the cracks occurred at top portions of the semiconductor chip, for example, in USG layers 52 or passivation layers Pass-1 and Pass-2. Particularly, interface 64 (refer to FIG. 3A) between passivation layers Pass-1 and Pass-2 is vulnerable to the cracking and cracks tend to propagate along interface 64 into semiconductor chip 41. Based on this finding, trench 66 is formed.

Trench 66 is formed over sacrificial seal ring 42. If viewed from top, trench 66 also forms a trench ring having four edges, each proximating a respective edge of semiconductor chip 41. Bottom 68 of trench 66 may reach interface 64. Bottom 68 may also extend below interface 64, for example, by greater than about 200 Å. However, a layer of passivation layer Pass-1 may remain over the top of metal line 46 to prevent metal line 46 from being exposed. An advantageous feature of trench 66 is that if a crack occurs during die sawing and propagates along interface 64, the crack will be stopped by trench 66. Even if the crack propagates across trench 66, if at all, the stress of the crack is substantially reduced by trench 66, and seal ring 44 will effectively prevent any further propagation of the crack. This provides dual insurance for crack prevention. It is appreciated that any crack occurring at a level higher than bottom 68 of trench 66 will be stopped, including those occurring in passivation layer Pass-2. Trench 66 may have width W3 greater about 1 μm to 2 μm. At the time the respective semiconductor wafer is sawed, trench 66 is not filled. After packaging processes, trench 66 is either unfilled, or may be filled with a material the same as, or different from, that of passivation layers Pass-1 and Pass-2.

Figure 4:
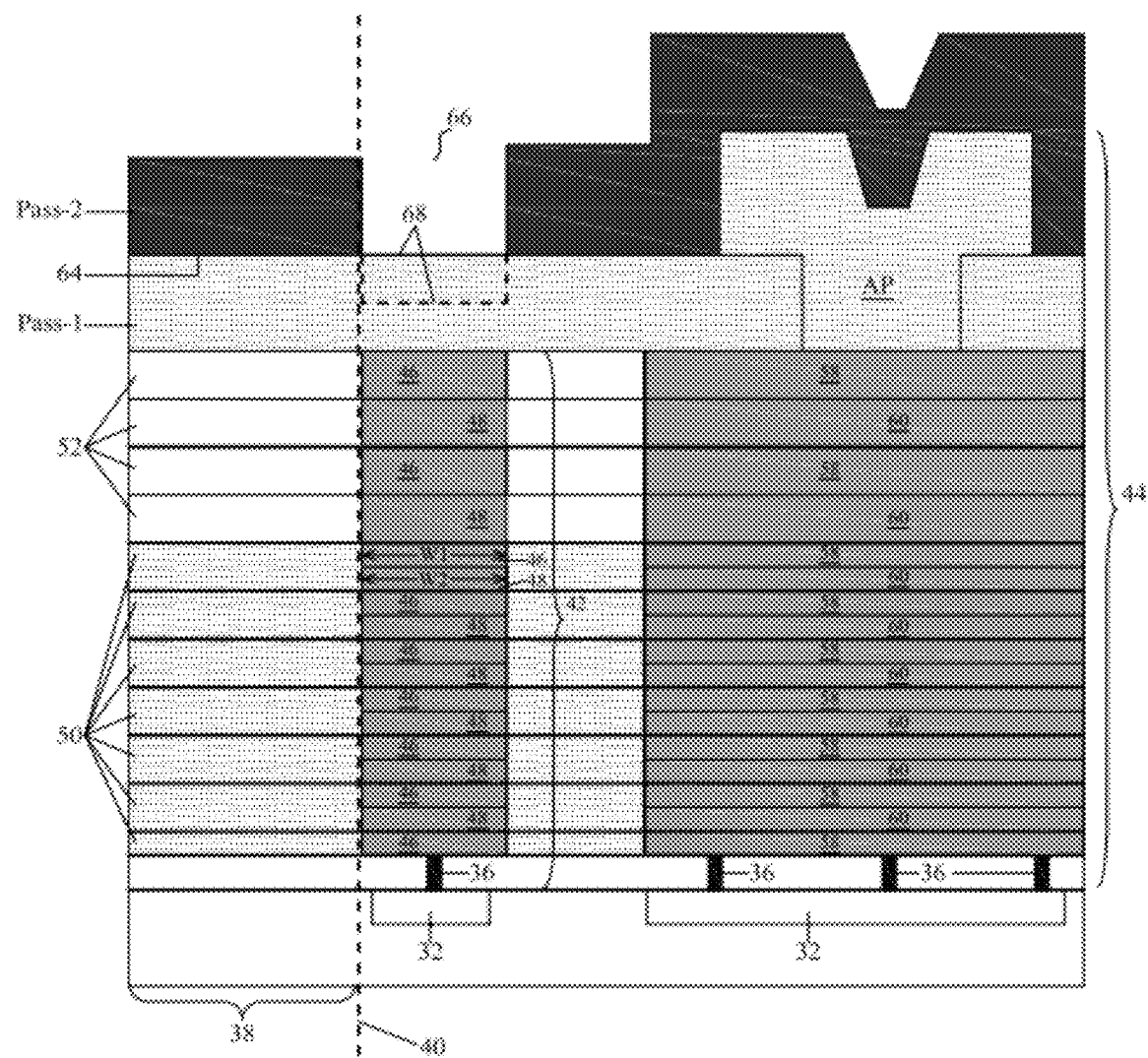
FIG. 4 is a cross-sectional view of an alternative embodiment of the present invention, wherein in each of the dielectric layers, the metal line ring and the via ring have substantially a same width.

FIG. 4 illustrates an alternative embodiment of the present invention. This embodiment is similar to the embodiment shown in FIGS. 3A and 3B, except vias 48 and 60 do not comprise discrete vias. Instead, each of vias 48/60 has a width substantially equal to the width of the overlying metal lines 46/58, respectively. Similar to the embodiment shown in FIGS. 3A and 3B, each of the metal lines 46/58, and vias 48/60 form a ring. Compared to the embodiment shown in FIGS. 3A and 3B, this embodiment may be formed with greater care in process details due to the high metal density caused by via rings 48/60. Again, trench 66 is formed over seal ring 42 and adjacent to scribe line 38, wherein trench 66 extends down to at least reach interface 64 between passivation layers pass-1 and pass-2, and possibly down into an intermediate level in passivation layer pass-1.

Figure 5:
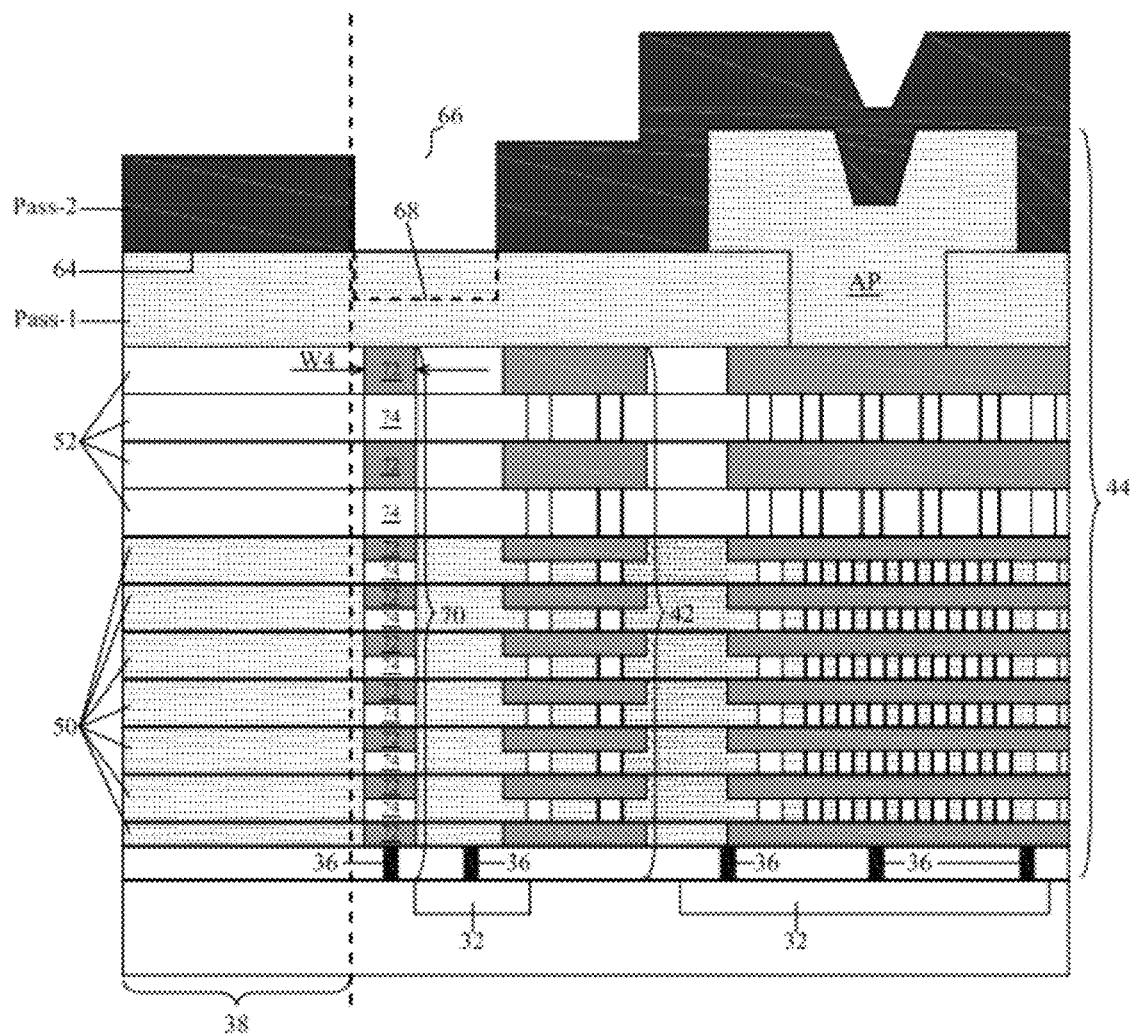
FIG. 5 is a cross-sectional view of yet another embodiment of the present invention including three seal rings.

FIG. 5 illustrates an alternative embodiment of the present invention. An additional sacrificial seal ring 70 is formed adjacent to scribe line 38. Seal ring 70 also includes metal line portion 72 and via portion 74 in USG layers 52. The widths of metal line portion 72 and via portion 74 may be substantially equal to each other, and are less than the widths of seal rings 42 and 44. In an exemplary embodiment, width W4 of seal ring 70 is about 0.5 μm. The small width of seal ring 70 advantageously results in the desirable reduction in the density of the metal features in the seal ring region. In addition, it still has the function of reducing the die-saw induced stress. Further, in the case, the kerf line accidentally passes through seal ring 70 due to the small width; therefore, less die-saw induced stress is applied to seal rings 42 and 44.

The embodiments of the present invention have improved ability for preventing cracks from propagating into circuit regions. Particularly, the enhanced protection schemes provide two-fold protection, one with a trench and one with a solid seal ring. Accordingly, the likelihood of the cracks propagating into circuit regions is significantly reduced.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a semiconductor chip comprising:
      a semiconductor substrate;
      a plurality of low-k dielectric layers over the semiconductor substrate;
      a first passivation layer over the plurality of low-k dielectric layers;
      a second passivation layer over the first passivation layer;
      a first seal ring adjacent to an edge of the semiconductor chip, wherein the first seal ring has an upper surface substantially level to a bottom surface of the first passivation layer; and
      a trench ring comprising at least a portion directly over the first seal ring, wherein the trench ring extends from a top surface of the second passivation layer down to at least an interface between the first passivation layer and the second passivation layer, without extending through the first passivation layer, while exposing the first passivation layer.

2. The integrated circuit structure of claim 1 further comprising a scribe line adjacent to the first seal ring, wherein an outer edge of the trench ring is substantially vertically aligned with an interface between the semiconductor chip and the scribe line.

3. The integrated circuit structure of claim 1, wherein the first seal ring comprises, in each of the plurality of low-k dielectric layers, a metal line ring and a via ring underlying the metal line ring.

4. The integrated circuit structure of claim 3, wherein the metal line ring and the via ring have substantially a same width.

5. The integrated circuit structure of claim 3, wherein the first seal ring further comprises, in the each of the plurality of low-k dielectric layers, discrete vias underlying and adjoining the metal line ring, wherein the discrete vias are aligned to a line having a ring-like shape.

6. The integrated circuit structure of claim 1 further comprising:
   an un-doped silicate glass (USG) layer between the plurality of low-k dielectric layers and the first passivation layer;
   an additional metal line ring in the USG layer and in the first seal ring; and
   an additional via ring in the USG layer and in the first seal ring, wherein the additional via ring is underlying and adjoining the additional metal line ring.

7. The integrated circuit structure of claim 1 further comprising a second seal ring adjacent to the first seal ring and on an inner side of the semiconductor chip than the first seal ring, wherein the second seal ring comprises a pad ring in the first passivation layer and the second passivation layer.

8. The integrated circuit structure of claim 7, wherein an entirety of the pad ring is covered by the second passivation layer.

9. The integrated circuit structure of claim 7 further comprising:
a third seal ring between the first seal ring and the second seal ring, wherein the third seal ring has a top surface substantially level with the bottom surface of the first passivation layer.

10. The integrated circuit structure of claim 7, wherein each of the first seal ring and the second seal ring further comprises a contact plug ring contacting the semiconductor substrate.

11. The integrated circuit structure of claim 1, wherein the trench ring extends into the first passivation layer, with a layer of the first passivation layer left covering the first seal ring.

12. An integrated circuit structure comprising:
a semiconductor chip comprising:
  a plurality of low-k dielectric layers;
  a first passivation layer over the plurality of low-k dielectric layers, wherein the first passivation layer has a first bottom interface;
  a second passivation layer over the first passivation layer, wherein the second passivation layer has a second bottom interface;
  a first seal ring having an upper surface substantially level with the first bottom interface, wherein in each of the plurality of low-k dielectric layers, the first seal ring comprises:
    a first metal line ring;
    a first via ring underlying the first metal line ring; and
    a first plurality of discrete vias underlying the first metal line ring;
  a second seal ring adjacent to the first seal ring and on an inner side of the first seal ring, wherein the second seal ring comprises a pad ring in the first passivation layer and the second passivation layer, and
  a trench ring comprising at least a portion directly over the first seal ring, wherein the trench ring extends from a top surface of the second passivation layer down to at least the second bottom interface; and
a scribe line adjoining the semiconductor chip, wherein the first seal ring has an outer edge substantially aligned with an interface between the semiconductor chip and the scribe line.

13. The integrated circuit structure of claim 12, wherein in each of the plurality of low-k dielectric layers the second seal ring further comprises a second via ring underlying the first metal line ring.

14. The integrated circuit structure of claim 12, wherein the first via ring is closer to the scribe line than the first plurality of discrete vias.

15. The integrated circuit structure of claim 12 further comprising an un-doped silicate glass (USG) layer over the first plurality of low-k dielectric layers.

16. The integrated circuit structure of claim 15, wherein the first seal ring further comprises:
a second metal line ring in the USG layer;
a third via ring underlying the second metal line ring and in the USG layer; and
a second plurality of discrete vias underlying the second metal line ring and in the USG layer; and
wherein the second seal ring further comprises:
a third metal line ring in the USG layer;
a fourth via ring underlying the third metal line ring and in the USG layer; and
a fourth plurality of discrete vias underlying the third metal line ring and in the USG layer.

17. The integrated circuit structure of claim 12, wherein an entirety of the pad ring is covered by the second passivation layer.

18. The integrated circuit structure of claim 12, wherein each of the first seal ring and the second seal ring further comprises a contact plug ring contacting a semiconductor substrate of the semiconductor chip.

19. The integrated circuit structure of claim 12, wherein the trench ring extends into the first passivation layer, with a layer of the first passivation layer remaining over the first seal ring.

20. The integrated circuit structure of claim 12, wherein the second seal ring comprises:
a second metal line ring;
a second via ring underlying the second metal line ring; and
a second plurality of discrete vias underlying the second metal line ring.

* * * * *